United States Patent [19]

Fraas et al.

[11] Patent Number: 5,401,329
[45] Date of Patent: Mar. 28, 1995

[54] THERMOPHOTOVOLTAIC RECEIVER ASSEMBLY

[75] Inventors: Lewis M. Fraas, Issaquah, Wash.; Robert M. Fraas, Palm Desert, Calif.

[73] Assignee: JX Crystals, Inc., Issaquah, Wash.

[21] Appl. No.: 70,668

[22] Filed: Jun. 2, 1993

Related U.S. Application Data

[63] Continuation-in-part of Ser. No. 906,452, Jun. 30, 1992, Pat. No. 5,312,521.

[51] Int. Cl.⁶ .......................................... H01L 31/058
[52] U.S. Cl. .................................... 136/253; 136/246
[58] Field of Search ........................ 136/246, 253, 248

[56] References Cited

U.S. PATENT DOCUMENTS

| | | | |
|---|---|---|---|
| 4,045,246 | 8/1977 | Mlavsky et al. | 136/246 |
| 4,131,485 | 12/1978 | Meinel et al. | 136/259 |
| 4,180,414 | 12/1979 | Diamond et al. | 136/246 |
| 4,776,895 | 10/1988 | Goldstein | 136/253 |
| 4,976,606 | 12/1990 | Nelson | 431/79 |
| 5,091,018 | 2/1992 | Fraas et al. | 136/246 |
| 5,096,505 | 3/1992 | Fraas et al. | 136/246 |

OTHER PUBLICATIONS

Fraas, A. P., Heat Exchanger Design Operating on Radiant Energy, Wiley–Interscience Publication, pp. 365–382 (U.S.A. 1989).
Fraas, A. P., Characteristics of Heat Sources, Engineering Evaluation of Energy Systems, pp. 96–125 (U.S.A. 1982).
Pelka, D. G. et al., Natural Gas-Fired Thermophotovoltaic System, Proceedings of the 32nd International Power Sources, pp. 110–123 (U.S.A. 1986).
Morgan, M. D. et al., Radioisotope Thermal Photovoltaic Application of the GaSb Solar Cell, NASA SPRAT Conference, pp. 349–348 (U.S.A. 1989).
Doellner, O. L., Aircraft Photovoltaic Power-Generating System, PhD Thesis University of Arizona, (U.S.A. 1991).
Fraas, A. P., Design and Development Tests of Direct-Condensing Potasssium Radiators, USAEC Report Conf-651026, (U.S.A. 1965).
Tester, et al., Comparative Performance Characteristics of Cylindrical Parabolic and Flat Plate Solar Energy Collectors, American Society of Mechanial Engineers, pp. 1–3 (U.S.A. 1974).
A. P. Fraas, Report ORNL/TM–9814, DOE Contract No. DE–AC05–840R21400, Oak Ridge National Laboratory, pp. 1–76 (U.S.A. 1986).
Fraas et al., Summary of the Research and Development Effort on Ceramic Gas Turbines, Oak Ridge National Laboratories, pp. 1–33 (U.S.A. 1977) Contract No. W–7405–eng–26.
E. D. Howe et al, Transactions of the A.S.M.E., pp. 673–677 (U.S.A. 1940).
Kittl and Guazzoni, Design Analysis of TPV–Generator System, PROC. 25th Annual Power Sources Conf., pp. 106–110 (U.S.A. 1972).
L. D. Woolf, Solar Cells, vol. 19, pp. 19–38 (1986–1987).
Day, A. C., et al., Application of the GaSb Solar Cell in Isotope-Heated Power Systems, Conference Record, 21st IEEE Photovoltaic Specialist Conf. Kissimmee, Fla. (1990), pp. 1320–1325.
Fraas, A. P., Magneto–Hydrodynamic Systems, Engineering Evaluation of Energy Systems, pp. 437–461, McGraw–Hill, Inc., 1982.

*Primary Examiner*—Aaron Weisstuch
*Attorney, Agent, or Firm*—James Creighton Wray

[57] ABSTRACT

In the present invention, we describe a generic interchangeable thermophotovoltaic (TPV) receiver assembly that can be incorporated in a variety of large or small TPV generators. Our TPV receiver assembly contains low bandgap TPV cells series connected along a line on a thermally conductive circuit carrier. The circuit carrier is directly bonded to a parallel cooling channel. The cooling channel also supports and cools parallel mirror elements which concentrate infrared energy efficiently to the series connected cell string. The cell interconnections are hidden under the mirror elements. The mirror elements, cooling channel, circuit carrier, and series connected cell string together form a linear TPV receiver assembly with + and − terminals on either end. Identical receiver assemblies can be packed side by side each facing an infrared emitter in a large variety of TPV generator configurations.

7 Claims, 2 Drawing Sheets

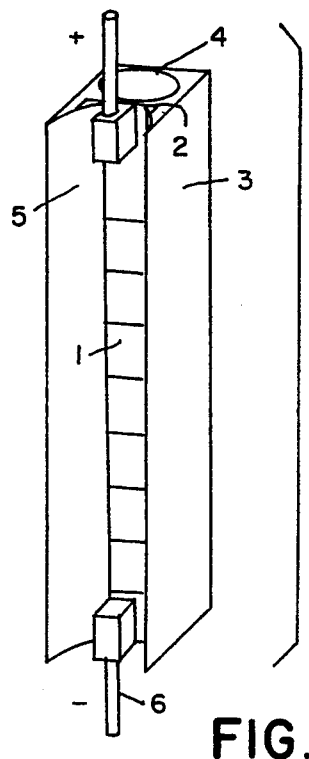
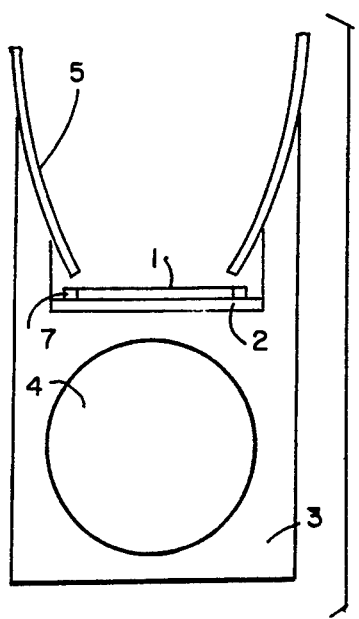
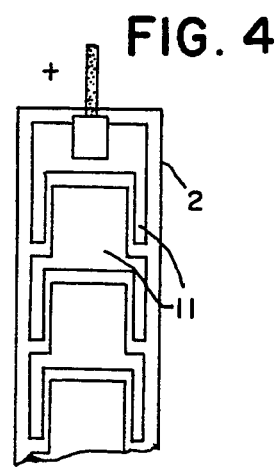
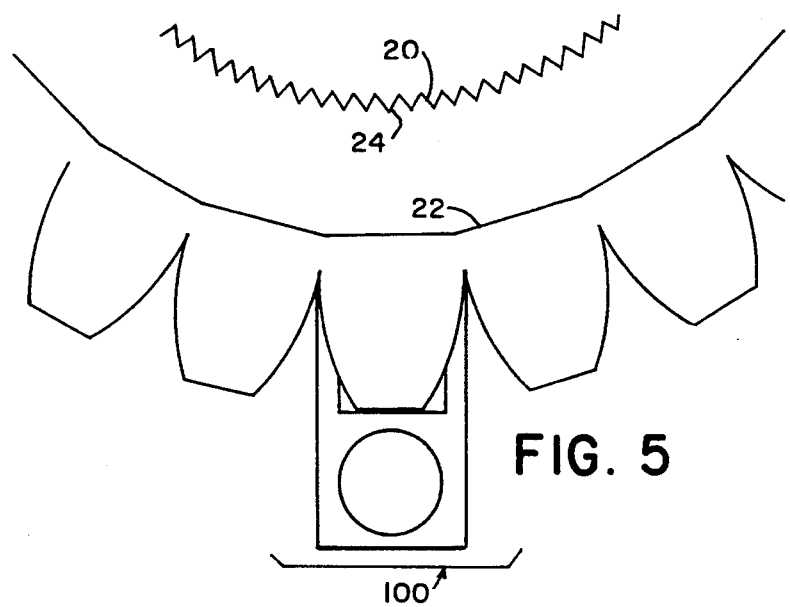
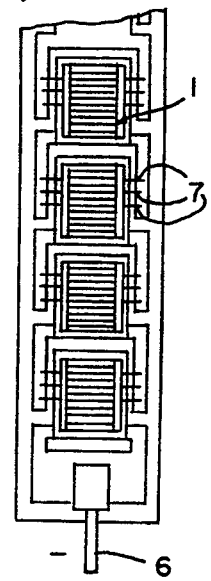
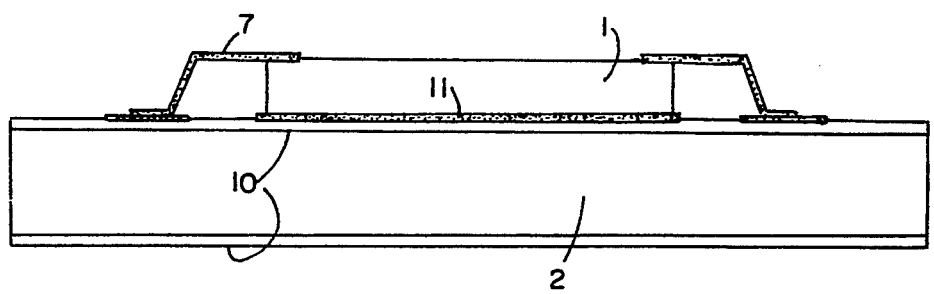

THERMOPHOTOVOLTAIC RECEIVER ASSEMBLY

This application is a continuation-in-part of U.S. patent application No. 07/906,452, filed Jun. 30, 1992, now U.S. Pat. No. 5,312,521. This earlier application and its listed references are incorporated herein by reference.

BACKGROUND

Various attempts to fabricate practical and economical thermophotovoltaic (TPV) power generators have been reported over the years. However, generator designs based on the use of silicon photovoltaic cells have been unsuccessful because of a requirement for very high temperature emitters (T>2300K). Without very high temperature emitters, TPV systems based on silicon cells are both inefficient and operate at low power densities. Selective emitters based on rare earth oxides have been described (M. K. Goldstein, U.S. Pat. No. 4,976,606) which improve efficiencies but still suffer from low power densities at practical emitter temperatures. Low power density generators are not economical for large volume energy production.

In 1989, L. M. Fraas et. al. described a new GaSb photovoltaic cell sensitive in the infrared (IR) out to 1.8 microns. Later in 1989, M. D. Morgan, W. E. Horne, and A. C. Day proposed using GaSb cells in combination with a radioisotope thermal source for space electric power and in 1991, O. L. Doellner proposed using GaSb cells looking at jet engine plumes to replace alternators on jet aircraft. Finally in 1992, A. P. Fraas and R. M. Fraas submitted U.S. patent application No. 07/906,452, now U.S. Pat. No. 5,312,521, and application Ser. No. 047,477, describing a small quiet natural gas fired TPV generator using GaInSb cells.

Now realizing that a variety of TPV generator designs are possible incorporating GaSb cells, we have invented a generic interchangeable TPV receiver assembly that can be incorporated in a variety of large or small generators. Our TPV receiver assembly incorporates series connected TPV cells in a line on a thermally conductive circuit carrier which is directly bonded to a parallel cooling channel. The cooling channel also supports and cools parallel mirror elements which concentrate infrared energy efficiently to the series connected cell string. The cell interconnections are hidden under the mirror elements. The mirror elements, cooling channel, circuit carrier, and series connected cell string together form a linear TPV receiver assembly with + and − terminals on either end. Identical receiver assemblies can be packed side by side, each facing the emitter in a large variety of TPV generator configurations.

No such TPV receiver assemblies have been described previously in the literature. The Doellner configuration is specific to a jet engine. Furthermore, the receiver descriptions found in Morgan et. al. and Goldstein et. al. both assume the cells are tightly packed in an array located very close to the emitter without IR concentrating elements. In the case that there is air between the emitter and the receiver assembly as would probably be the case for economical consumer products, it is desirable to have a significant spacing between the emitter and the IR TPV receiver to minimize heat transfer by nonradiative means. In this case, it is desirable to use IR concentrating elements to restore the IR power density at the TPV cell location back to the level available at the surface of the emitter. The use of IR concentrating elements will therefore minimize the amount of expensive single crystal TPV cell material required.

In summary, there is a need for a TPV receiver assembly design which provides for series connecting circuitry, high power conversion efficiency, high infrared power densities, good thermal management, modularity, and simplicity. Our receiver design accomplishes all of these goals.

SUMMARY OF THE INVENTION

The present invention relates to thermophotovoltaics and more particularly to the use of new low bandgap cells such as GaSb, $Ga_{1-x}In_xSb$ (where x has any value between 0.0 and 0.2), $In_{1-x}Ga_xAs$ (where x has any value between 0.4 and 0.6), or Ge photovoltaic cells sensitive to IR radiation down to 1.8 microns. These new cells allow the use of lower temperature (eg. 1800K) ceramic thermal emitters. Previous silicon cells required the operation of man-made IR emitters at impractically high temperatures where materials problems severely limited emitter lifetimes. These new low bandgap cells can be wired in series strings and combined with hydrocarbon fired burner/emitter designs to create a variety of practical TPV electric generators. One such small TPV generator can serve as a compact, quiet, light weight, and clean burning DC electric power supply for off grid electric power for mountain cabins or third world village homes. A larger 10 kW unit could be used as a power system in electric vehicles where it could run cleaner than the internal combustion engine and reduce battery size and weight. All of these hydrocarbon fired TPV generator designs could use the same modular interchangable TPV receiver assembly.

In the present invention, we describe a generic interchangeable TPV receiver assembly that can be incorporated in a variety of large or small generators. Our TPV receiver assembly contains low bandgap TPV cells series connected along a line on a thermally conductive circuit carrier. The circuit carrier is directly bonded to a parallel cooling channel. The cooling channel also supports and cools parallel mirror elements which concentrate infrared energy efficiently to the series connected cell string. The cell interconnections are hidden under the mirror elements. The mirror elements, cooling channel, circuit carrier, and series connected cell string together form a linear TPV receiver assembly with +and − terminals on either end. Identical receiver assemblies can be packed side-by-side each facing the emitter in a large variety of TPV generator configurations.

A first important feature of the present invention is the use of a metallic thermally conducting circuit carrier with a thin insulating film on its front surface on which the circuit pads are deposited. The TPV cells and interconnect leads are soldered down to this circuit carrier. Besides allowing heat to easily pass through, this circuit carrier also serves to spread the heat laterally to a larger contact area where heat is passed on to the cooling channel.

A second important feature of the present invention is the use of a single extruded metal cooling channel element which, besides containing the cooling channel, also supports the circuit carrier, mirror elements, and end connectors.

A third important feature of the present invention is the use of arced mirror elements to efficiently concentrate the IR energy to the cells while simultaneously shielding the interconnecting cell leads.

A final important feature of this invention is the mirror arc design which approximates an ellipse, the ellipse having been defined with one foci on the edge of the TPV cell and the other foci on the emitter. By this design, it will be shown that a large fraction of the IR energy leaving the emitter will arrive at a TPV cell with no more than one reflection off an arced mirror.

These and other features of the invention will become more fully apparent from the claims, and from the description as it proceeds in conjunction with the appended drawings.

BRIEF DESCRIPTION OF THE DRAWINGS

FIG. 1 shows a three dimentional view of our TPV receiver assembly.

FIG. 2 shows a cross section through our TPV receiver assembly.

FIG. 3 shows a cross section through a circuit carrier with metal circuit pads, TPV cell, and interconnecting leads also shown.

FIG. 4 shows a top view of a circuit carrier partially loaded with interconnected TPV cells.

FIG. 5 shows a TPV receiver assembly arrayed with other receiver assemblies facing an IR emitter. A glass convective shield is also shown midway between the emitter and receiver.

DETAILED DESCRIPTION OF PREFERRED EMBODIMENT

Figure 6:
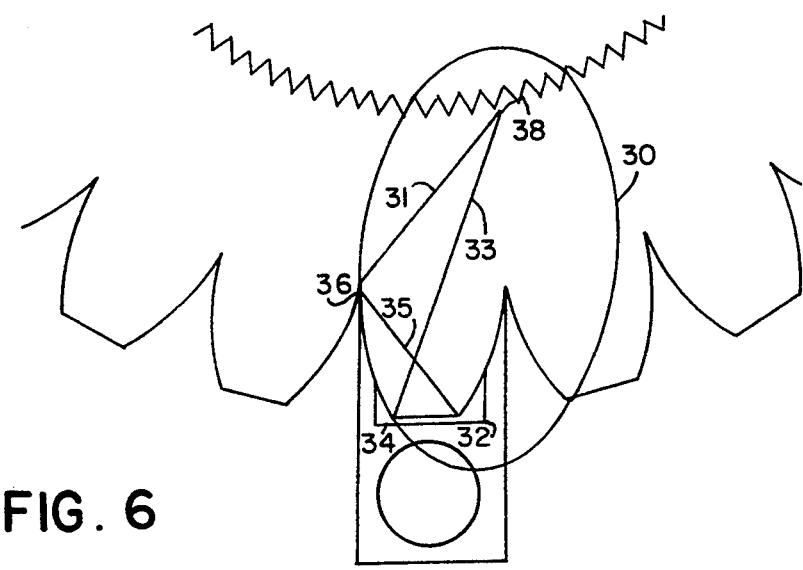
FIG. 6 shows the ellipse used to define the mirror shape superimposed on the scene of FIG. 5.

FIG. 1 shows a three dimensional view of our TPV receiver assembly 100. Low bandgap TPV cells 1 are mounted on a thermally conductive circuit carrier 2. The circuit carrier 2 is mounted on an extruded metal cooling element 3. The cooling element 3 contains a cooling channel 4 and also supports arced mirror elements 5. + and − end connector pins 6 are supported on the circuit carrier.

FIG. 2 shows a cross section through the TPV receiver assembly 100. Elements 1 through 5 are again shown. The cell interconnects 7 are also shown under the arced mirror elements 5. Referring to this figure, the receiver assembly fabrication sequence can be enumerated as follows. First leads are attached to each cell. Then the cells and end connectors are soldered to the circuit carriers. Circuit carriers are then bonded onto the cooling element using thermally conductive adhesive. The receiver assembly is completed with the bonding of the mirror elements onto the cooling element using the same thermally conductive adhesive.

FIG. 3 shows an enlarged view of the circuit carrier 2. This circuit carrier is metallic for good thermal conductivity with thin insulating coatings 10 on both sides. In our present embodiment, this carrier is aluminum and the insulation 10 is a double layer consisting of aluminum oxide followed by a coating of polyimide to approximately 3 microns thickness. The circuit metallization pattern 11 is deposited on the front side of this circuit carrier by conventional circuit board fabrication techniques. Low bandgap TPV cells 1 with interconnecting leads 7 are soldered directly to the front face of this circuit carrier.

FIG. 4 shows a top view of the circuit carrier 2 showing the TPV cells 1, the metallization pattern 11, the interconnecting leads 7, and the end connecting pins 6.

FIG. 5 shows an array of our TPV receiver assemblies with the center assembly 100 shown in more detail. The TPV receiver assemblies are packed side by side with each assembly facing toward the emitter 20. A glass heat shield 22 is shown in between the receivers 100 and the emitter 20. The emitter is shown as containing grooves 24. Because the tips between grooves run cooler than the groove valleys, these grooves 24 tend to enhance the radial IR emission at the expense of the tangential IR emission. The glass heat shield 22 is coated with a selective IR coating (not shown) which reflects the nonuseful IR (wavelengths longer than 2 microns) back to the emitter while transmitting the useful IR (wavelengths between 1 and 2 microns) to the TPV cells. Besides IR selectivity, this heat shield 22 serves to limit convective and conductive heat transport through the air filled space likely to be present in lower cost commercial generators.

FIG. 6 shows the scene of FIG. 5 with a superimposed ellipse 30 used to generate the appropriate mirror shape. An ellipse as an optical element has the property that all light leaving one foci will arrive at the other foci. So if one foci is placed at the right hand edge of the TPV cell 32 and the other foci is placed on the emitter 38, all rays exiting from that point 38 at the emitter will arrive at the right hand edge of the cell 32. Using the property that all ray paths are equal in length and the fact that the ellipse will pass through the left hand edge of the cell 34 and the left hand mouth 36 of the receiver aperture and the fact that the foci 38 must fall on the emitter, the second focal point 38 is uniquely located and the ellipse is uniquely defined. Once this ellipse is defined, then we are assured that rays 31, 33 leaving point 38 striking the left hand mirror will arrive at the right hand edge of the cell at point 32. Similarly, rays leaving the emitter to the left of point 38 striking the left hand mirror will arrive at the cell at points to the left of point 32. This elliptical mirror surface maximizes the probability that an IR ray leaving the emitter arrives at a cell with no more than 1 reflection. Thus, parasitic losses at the mirror surfaces are minimized and the IR intensity at the TPV cell is maximized.

Figure 7:
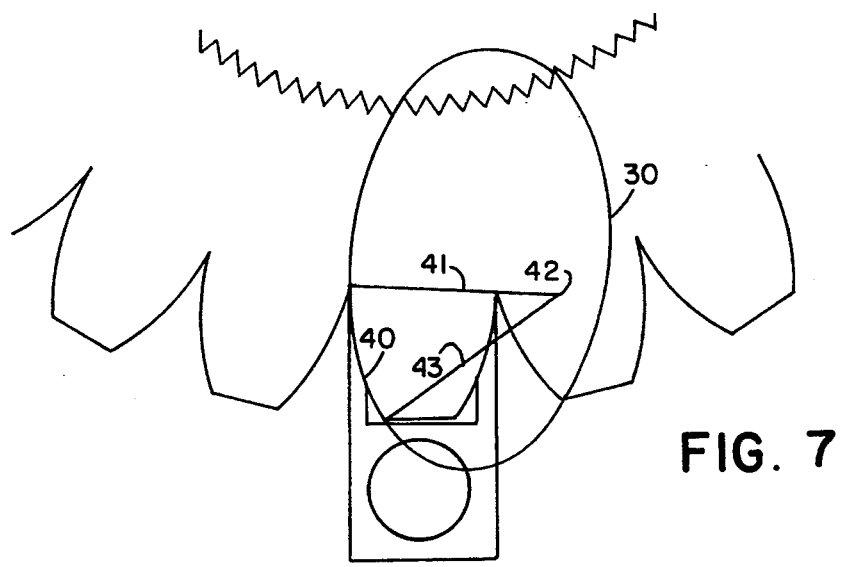
FIG. 7 shows the mirror arc superimposed on the scene of FIG. 6.

FIG. 7 shows a circular arc segment 40 superimposed on the ellipse 30. As can be seen, a circular arc segment closely approximates the mirror section at the receiver. Mirror arc segments are easily and inexpensively formed in aluminum sheet metal. The circular arc is generated by picking the point on the ellipse at the mouth of the receiver 36 and the left hand edge of the TPV cell 34 and a point on the ellipse half way between. The arc radius 41, 43 and the arc center point 42 are used to fabricate the extrusion die for the cooling element and the arced mirror segments 5.

Figure 8:
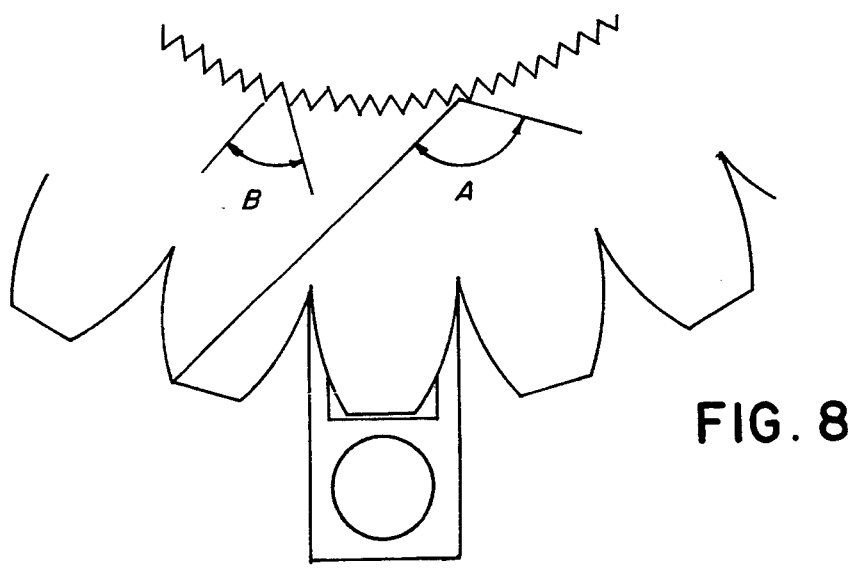
FIG. 8 shows the angle (A) within which IR rays leaving the emitter arrive at a TPV cell with no more than one reflection off an arced mirror. For a grooved emitter with groove angle (B), most of the IR rays are contained within the smaller angle (B).

FIG. 8 shows angles (A) and (B). Angle (A) is the angle viewed from point 38 on the emitter within which all IR rays will arrive at a TPV cell with no more than a single reflection. For the case drawn, angle (A) is 130 degrees. Since angle (A) is less than 180 degrees, the capture efficiency is less than 100%. However, since angle (A) is quite large and in particular larger than the groove angle (B), the capture efficiency should exceed $130/180 = 72\%$.

Our present TPV receiver design contains 16 GaSb cells on a circuit carrier 4" long by 0.5" wide. The resultant receiver assembly when used with a blackbody emitter generates 6 volts at up to 3 amps for a power output of up to 18 Watts.

Various changes and alterations may be made without parting from the spirit of the invention disclosed herein. All changes and modifications which fall within the scope of the claims and equivalents thereof are intended to be embraced thereby.

We claim:

1. A thermophotovoltaic apparatus comprising an infrared emitting surface and plural linear thermophotovoltaic receiver assemblies, wherein each linear thermophotovoltaic receiver assembly consists of a linear extruded metal support element containing one or more cooling channels with a thermally conductive circuit carrier mounted on a flat surface facing and in close proximity with said infrared emitting surface, said circuit carrier containing series connected low bandgap thermophotovoltaic cells mounted along a row parallel to the extrusion direction, said extruded metal support element providing cooling for said thermophotovoltaic cells, said extruded metal support element also containing columns on either side of said circuit carrier supporting and cooling linear arced mirror elements which serve to funnel radiation arriving from said infrared emitting surface to said thermophotovoltaic cells, said arced mirror elements also shielding the leads interconnecting said thermophotovoltaic cells from said infrared emitting surface.

2. The thermophotovoltaic apparatus of claim 1 where the low bandgap thermophotovoltaic cells are responsive out to 1.8 microns.

3. The thermophotovoltaic apparatus of claim 1 where the circuit carrier is aluminum with a polyimide coating onto which the metal circuit is deposited.

4. The thermophotovoltaic apparatus of claim 1 where the arced mirror elements closely approximate a segment of an ellipse where one foci of said ellipse lies at one edge of the thermophotovoltaic cell and the other foci lies on the infrared emitter surface.

5. The thermophotovoltaic apparatus of claim 1 where the low bandgap cells are $Ga_{1-x}In_xSb$ cells where x has any value between 0.0 and 0.2.

6. The thermophotovoltaic apparatus of claim 1 where the low bandgap cells are $In_{1-x}Ga_xAs$ cells where x has any value between 0.4 and 0.6.

7. The thermophotovoltaic apparatus of claim 1 where the low bandgap cells are Ge cells.

* * * * *